United States Patent
Hautvast et al.

(10) Patent No.: US 9,324,150 B2
(45) Date of Patent: Apr. 26, 2016

(54) EFFICIENT CARDIAC MR WORKFLOWS BASED ON AUTOMATED PLANNING FROM MDIXON SURVEYS

(71) Applicant: KONINKLIJKE PHILIPS N.V., Eindhoven (NL)

(72) Inventors: Guillaume Leopold Theodorus Frederik Hautvast, Eindhoven (NL); Wendy De Kok-Strijbos, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/414,635

(22) PCT Filed: Jul. 17, 2013

(86) PCT No.: PCT/IB2013/055888
§ 371 (c)(1),
(2) Date: Jan. 13, 2015

(87) PCT Pub. No.: WO2014/013460
PCT Pub. Date: Jan. 23, 2014

(65) Prior Publication Data
US 2015/0193921 A1    Jul. 9, 2015

Related U.S. Application Data

(60) Provisional application No. 61/672,815, filed on Jul. 18, 2012.

(51) Int. Cl.
*G06K 9/00* (2006.01)
*G06T 7/00* (2006.01)
(Continued)

(52) U.S. Cl.
CPC .............. *G06T 7/004* (2013.01); *G01R 33/543* (2013.01); *G01R 33/5608* (2013.01);
(Continued)

(58) Field of Classification Search
USPC ......... 382/100, 103, 106–107, 128–134, 162, 382/168, 173, 181, 199, 203, 209, 219, 232, 382/254, 274, 276, 286–291, 305, 312; 378/4, 21; 324/309
See application file for complete search history.

(56) References Cited

U.S. PATENT DOCUMENTS 7,684,604 B2    3/2010  Bystrov
7,711,160 B2 *  5/2010  O'Donnell .............. G06T 7/004
                                                  382/128

(Continued)

OTHER PUBLICATIONS

Otsu, Nobuyuki "A Threshold Selection Method from Gray-Level Histograms", IEEE Transactions on Systems, Man, and Cypernetics, vol. 9, No. 1, Jan. 1979, pp. 62-66.
(Continued)

*Primary Examiner* — Seyed Azarian

(57) ABSTRACT

A system (10) for planning cardiac MRI views, said system (10) includes a planning device (16) which includes at least one processor (42) programmed to: receive one or more images (18) from an imaging device (12) acquired utilizing an mDIX-ON protocol, determine a position and orientation of an object of interest from the one or more images, transform a model of the object of interest such that is matches the object of interest with a generalized Hough transform, and generate one or more object of interest views from the matching of the object of interest, A display (48) displays the one or more object of interest views.

14 Claims, 3 Drawing Sheets

(51) Int. Cl.
*G01R 33/54* (2006.01)
*G01R 33/56* (2006.01)
*G06K 9/46* (2006.01)
*G06K 9/62* (2006.01)
*A61B 6/00* (2006.01)
*G01R 33/48* (2006.01)

(52) U.S. Cl.
CPC .......... *G06K 9/4604* (2013.01); *G06K 9/6201* (2013.01); *G01R 33/4828* (2013.01); *G06T 2207/10088* (2013.01); *G06T 2207/30048* (2013.01)

(56) References Cited

U.S. PATENT DOCUMENTS

| | | | |
|---|---|---|---|
| 7,715,627 B2 | 5/2010 | Sun | |
| 7,903,852 B2 | 3/2011 | Springorum | |
| 8,165,377 B2* | 4/2012 | Vaidya | A61B 5/055 382/129 |
| 8,565,505 B2 | 10/2013 | Bergmans | |
| 8,565,506 B2* | 10/2013 | Marshall | G06T 7/0012 382/132 |
| 2010/0127702 A1* | 5/2010 | Greiser | G01R 33/3875 324/309 |
| 2011/0206260 A1 | 8/2011 | Bergmans | |
| 2012/0108946 A1 | 5/2012 | Kuhara | |
| 2012/0126812 A1* | 5/2012 | Nitta | A61B 5/0044 324/309 |

OTHER PUBLICATIONS

Bull, Russell et al "First Clinical Experiences with a Prototype of a Novel Cardiac Workflow Engine", Clinical Cardiovascular, Magnetom Flash, vol. 3, 2009, pp. 6-11.

Ballard, D.H. Generalizing the Hough Transform to Detect Arbitrary Shapes, Pattern Recognition, vol. 13, No. 2, 1981, pp. 111-122.

Lu, Xiaoguang et al "Automatic View Planning for Cardiac MRI Acquisition", Medical Image Computing and Computer-Assisted Intervention a MICCAI 2011, pp. 479-486.

Eggers, Holger et al "Dual-Echo Dixon Imaging with Flexible Choice of Echo Times" Magnetic Resonance in Medicine, vol. 65, No. 1, 2011, pp. 96-107.

"mDIXON Being Developed to Simplify and Accelerate Liver MRI", Sep. 2010.

Lelieveldt, B.P.F. et al "Automated Observer-Independent Acquisition of Cardiac Short-Axis MR Images: a Pilot Study", Radiology, Radiological Society of North America, Inc., vol. 221, No. 2, Nov. 2001, pp. 537-542.

* cited by examiner

EFFICIENT CARDIAC MR WORKFLOWS BASED ON AUTOMATED PLANNING FROM MDIXON SURVEYS

CROSS-REFERENCE TO PRIOR APPLICATIONS

This application is the U.S. National Phase application under 35 U.S.C. §371 of International Application No. PCT/IB2013/055888, filed on Jul. 17, 2013, which claims the benefit of U.S. Provisional Patent Application No. 61/672,815, filed on Jul. 18, 2012. These applications are hereby incorporated by reference herein.

The present application relates generally to image processing. It finds particular application in conjunction magnetic resonance (MR) scanning workflow, especially, but not limited to, the automatic planning of standard cardiac views using MR imaging. However, it is to be understood that it also finds application in other usage scenarios and is not necessarily limited to the aforementioned application.

In diagnostic cardiac magnetic resonance (CMR), radiologists expect the output ages, particularly the slice images, to have certain orientations. These orientations are typically measure based on the long axis of the left ventricle. Before the diagnostic images are generated, a series of images must be analyzed to determine the orientation of the long axis of the left ventricle. As shown in FIG. 1, CMR images 2 are typically acquired in standard cardiac views known as short axis (SA) 4, long axis (LA) two chamber (2CH) 6, LA three chamber (3CH) and LA four chamber (4CH) 8 views. To image cardiac anatomy in these views, double oblique planning of acquisition slices is required. To obtain the double oblique scan planes, commercially available scanning software requires a step-wise procedure involving intermediate scans and re-planning This step-wise procedure is time consuming (five minutes for an experienced operator) and often requires additional operator training.

To reduce the duration of a CMR exam and the cost of operator training, improved planning of the cardiac views has been introduced. For example, interactive task guided planning software that uses multi-planar reconstruction (MPR) of high-resolution volumetric survey scans exist. Furthermore, automated planning approaches have been introduced which rely on model-based segmentation of high-resolution volumetric survey scans. These solutions aimed at alleviating the burden of planning the cardiac views rely on the acquisition of a volumetric survey scan which faces various challenges.

First, to be valuable in the imaging and planning workflow, the volumetric survey scan has to be quick. From the perspective of clinical use, exceeding one minute of scan time in a survey is deemed unacceptable. The second challenge is avoiding motion artifacts in the context of cardiac imaging. Therefore, the volumetric survey needs to be acquired using cardiac triggering, which is unfortunately associated with a slowdown, as data cannot he acquired continuously. In addition, the scan duration needs to be shorter than a single breath hold, to avoid artifacts from respiratory motion. Respiratory gating as a strategy for eliminating respiratory motion is not desirable, as it requires an additional scan to plan a respiratory navigator, which introduces further slowdowns due to navigator deficiencies.

Further challenges are B0 and B1 inhomogeneities. Without counter measures, the most commonly used protocol for volumetric CMR imaging, balanced steady state free precession (SSFP), produces signal voids that hamper automated post-processing for planning the image geometries. A common solution to this problem is the setup of a shim-box, which can only be positioned correctly based on a previous scan, which again takes additional time.

Next to the challenges in the acquisition part of the automated planning, the image processing is for planning the cardiac views is also not trivial. Planning the cardiac views relies on segmenting the heart, which is commonly performed using model based segmentation methods. Various techniques that have been employed in the past, do not meet performance requirements by today's standards on today's computer hardware. Thus, the compromises during acquisition and processing of the volumetric survey scans negatively affect the workflow at the scanner.

The present application provides new and improved methods and systems which overcome the above-referenced challenges and others.

In accordance with one aspect, a system for planning cardiac views is provided. The system including at least one processor programmed to receive one or more images including an object of interest acquired utilizing an mDIXON protocol, determine a position and orientation of the object of interest from the one or more images, match a model of the object of interest to the position and orientation of the object of interest, generate one or more object of interest views from the matching of the object of interest, and display the one or more object of interest views on a display device.

In accordance with another aspect, a method for planning cardiac views is provided. The method including receiving one or more images including an object of interest acquired utilizing an mDIXON protocol, determining a position and orientation of the object of interest from the one or more images, matching a model of the object of interest to the position and orientation of the object of interest, generating one or more object of interest views from the matching of the object of interest, and displaying the one or more object of interest views on a display device.

In accordance with another aspect, a system for planning cardiac views is provided. The system including a planning device which includes at least one processor programmed to: receive one or more images from an imaging device acquired utilizing an mDIXON protocol, determine a position and orientation of an object of interest from the one or more images, transform a model of the object of interest such that is matches the object of interest with a generalized Hough transform, and generate one or more object of interest views from the matching of the object of interest, A display displays the one or more object of interest views.

One advantage resides in the automated planning of standard cardiac views for CMR imaging.

Another advantage resides in the time efficient planning of standard cardiac views for CMR imaging.

Another advantage resides in the planning of cardiac views based on a single breath hold scan.

Another advantage resides in increased patient throughput.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Typically, planning of cardiac views is a difficult and time consuming procedure. Automation of this procedure requires a volumetric scan that has proven to be difficult to acquire using existing protocols within the constraints of clinical practice. The present application alleviates the burden of planning of cardiac views by utilizing mDIXON protocol to acquire a volumetric survey scan that is processed using fast and dedicated image processing. Specifically, a volumetric survey scan is acquired using a cardiac triggered mDIXON protocol. This scan is analyzed using a highly optimized generalized Hough transform (GHT) to identify the global position and orientation of the heart. Based on the result of the GHT, the cardiac views are planned. Thus, the present workflow enables the planning of cardiac views based on a single breath hold scan and minimal image processing.

Figure 2:
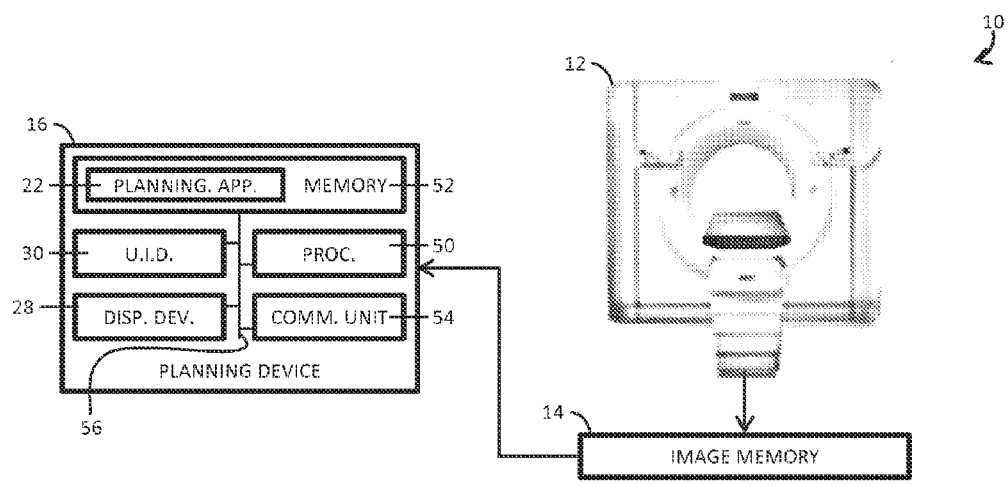
FIG. 2 illustrates a block diagram of a system for cardiac magnetic resonance workflows in accordance with the present application.

With reference to FIG. 2, a therapy system 10 provides automatic planning of standard cardiac views using an mDIXON protocol scan sequence, in a two point mDIXON scan sequence, the scan sequences includes two echo times and in a three-point mDIXON scan sequence, the scan sequence includes three echo times. From these different echoes, the therapy system 10 generates images including local gray scale transitions or changes in gray scale gradient magnitude that are used to identify the heart, determine the global position of the heart, and the heart's orientation. The therapy system 10 then utilizes a GHT to transform an explicit heart model such that it best matches the heart's edge voxels from the generated images. This model is then used to calculate the appropriate edges and angles of the heart and generate the standard cardiac views.

The therapy system 10 includes one or more imaging modalities 12 for acquiring images of objects of interest (OOI), such as a left ventricle, within patients. The imaging modalities 12 suitably include one or more of a magnetic resonance (MR) scanner, cardiac magnetic resonance (CMR) scanner, and the like. The therapy system 10 acquires a source volumetric data set as a stack of image slices using a cardiac gated mDixon protocol scan sequence. Images 18 acquired from the imaging modalities 12 are stored in one or more image memories 14.

Figure 3:
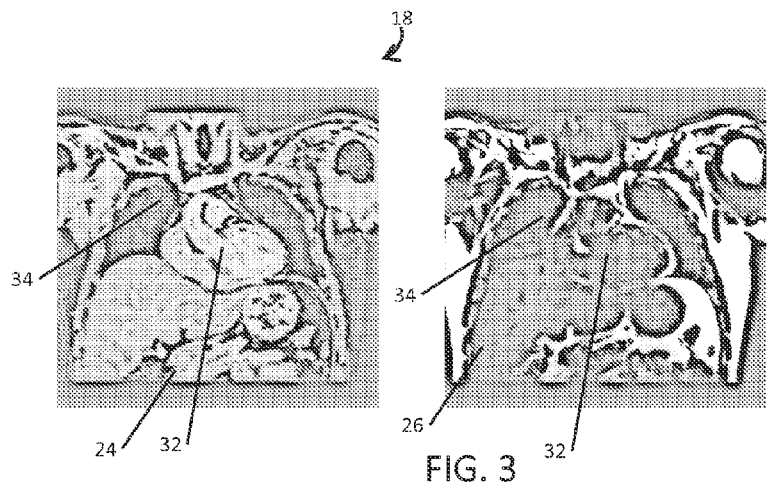
FIG. 3 illustrates an exemplary cardiac magnetic resonance images in accordance with the present application.
Figure 4:
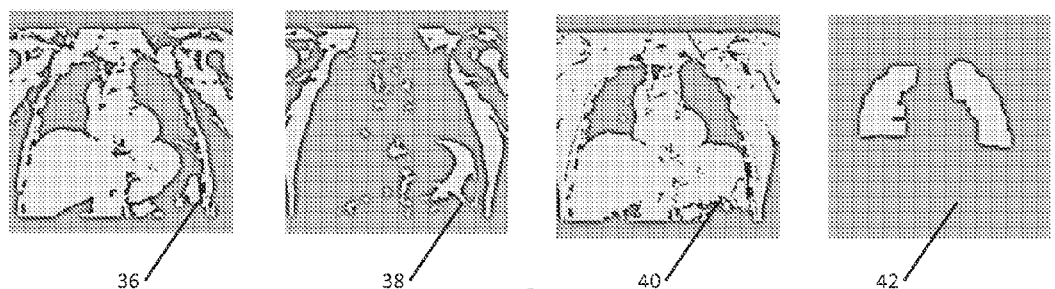
FIG. 4 illustrates another exemplary cardiac magnetic resonance images in accordance with the present application.

In the mDIXON scan sequence, the therapy system 10 generates a set of images 18 including a water image 24 and a fat image 26 as shown in FIG. 3. The therapy system 10 utilizes the images 18 from the mDIXON to automatically plan cardiac views. For example, the fat image 26 is utilized for determining the global position of the heart 32. Specifically, the fat 26 and water 24 images are both light in the area of the lungs 34 where there is air rather than water or fat tissue. Given the area of the lungs 34, the position of the heart 32 is readily projected. The water image 24, with or without assistance from the fat image 26, is used to identify the heart 32 and its orientation for the cardiac images.

The cardiac triggered mDIXON protocol is less sensitive to B0 and B1 inhomogeneities, such that there is no need for positioning shim-boxes. The protocol is also used in parallel imaging to achieve acquisitions within a single breath hold, Additionally, the mDIXON acquisition generates separate images for the water and fat content of the body. In one embodiment, the mDIXON acquisition is a non-selective, cardiac triggered acquisition covering a 700 mm field of view in a single breath hold. In one advantageous embodiment, the scan is accelerated using SENSE factor 4 in right-left direction and SENSE factor 2 in anterior-posterior direction. The scan further includes a repeat time TR=2.1 ms, first echo time TE1=0.63 ms, second echo time TE2=1.4 ms, and shot duration 180 ms at 60 heart beats per minute. It should also be appreciated that other image acquisitions workflows are also contemplated.

A planning device 16 receives the images 18, such as a water 24 and a fat 26 image of an object of interest (OOI), such as a left ventricle, as shown in FIG. 3, The received images 18 can, for example, be a Dynamic Contrast Enhanced MR image, CMR image, and the like. Typically, the images 18 are received from the imaging modalities 12 and/or the image memories 14. For example, the image 18 can be received from the imaging modalities 12 through the image memories 14. However, other sources for the image 18 are contemplated. Further, the image 18 is typically received from magnetic resonance modalities. Through a planning application 22 of the planning device 16, the planning device 16 automatically plans standard cardiac views of the received images 18. More specifically, local gray scale transitions or changes in gray scale gradient magnitude of the images 18 are used to identify the edges of the heart and between the walls of the heart chambers and the blood. The local transitions provide a segmentation which is refined with non-maximum suppression. For example, a generalized Hough transform (GUT) is used to transform an explicit heart model such that it best matches the extracted edge voxels. This model is then used to calculate the appropriate edges and angles for the standard cardiac views which are displayed on the planning device 16.

When the planning application 22 is executed, a user interface thereof is displayed on a display device 30 of the planning device 16. The user interface suitably allows an associated user to view the received images 18. Further, the user interface allows the associated user to select an OOI on the received imaged 18 using a user input device 28 of the planning device 16. The planning device 16 utilizes the images of the OOI to automatically plan standard cardiac views and displays the cardiac views on the display device 30. In some embodiments, the user interface further allows the associated user to specify parameters for planning using the user input device 28.

Figure 1:
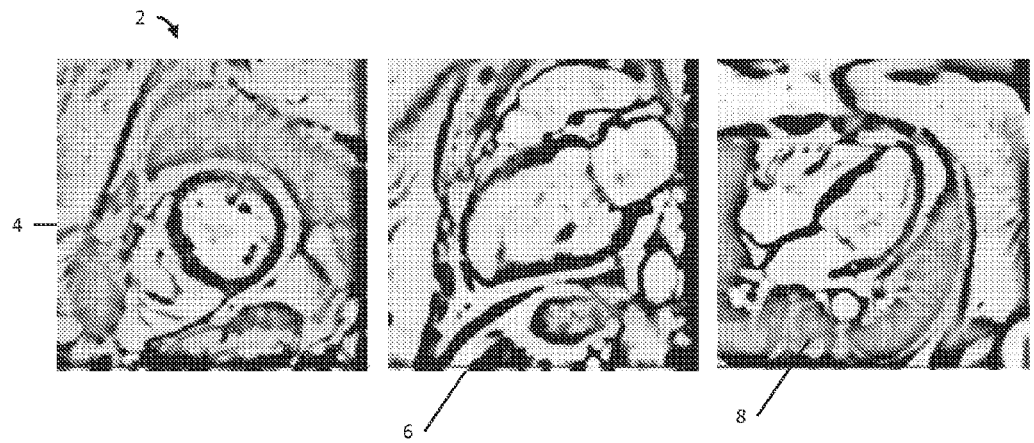
FIG. 1 illustrates standard cardiac views in accordance with the present application.
Figure 5:
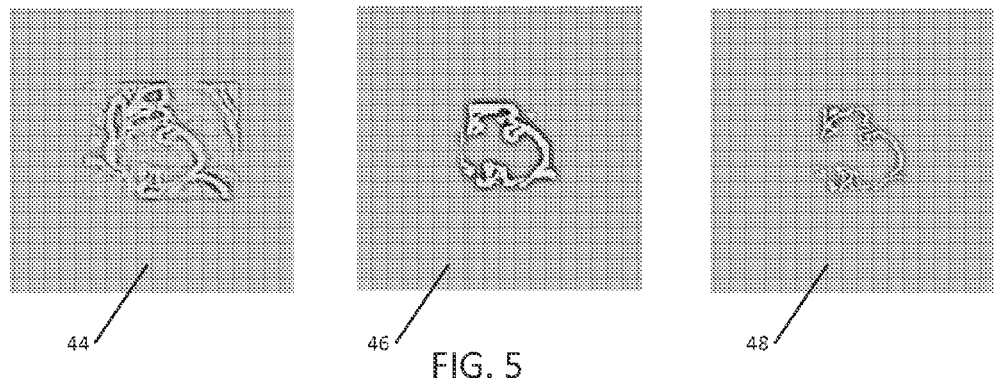
FIG. 5 illustrates additional exemplary cardiac magnetic resonance images in accordance with the present application.

To accomplish this, the planning device 16 processes the water and fat images to obtain a location of an OOI within the patient, Specifically, the fat image is utilized for determining the global position of the heart. The water image, with or without assistance from the fat image, is utilized to identify the heart and its orientation. As shown in FIG. 3, the planning device 16 segments and thresholds a water image 36 and a fat image 38. The thresholded water and fat segmentations are joined into a combined image 40 and processed to obtain the location of the lungs 42. After the location of the lungs is determined, the planning device 16 utilizes the relation between the water image 36 and the fat image 38 to locate the position and orientation of the heart. Specifically, given the localization of the lungs, Gaussian derivative filters extract gradient magnitudes and partial derivatives from the fat and water segmentation. Automated thresholding and non-maximum suppression enables extraction of edge voxels of the heart to be utilized during template or model matching. As shown in FIG. 5, an example of a slice 44 of a gradient magnitude computed inside the OOI is illustrated. The slice is segmented using automatic thresholding 46 and non-maximum suppression 48. A template or model matching transforms an explicit heart model such that the model matches best with the extracted edge voxels. For example, a GMT matches the heart model to match the extracted edge voxels. The GHT is a convolution of the model, described by a relative position and surface normals, with the position and gradient directions in the edge voxels. When the surface normals align with the gradient directions, votes are casted to a candidate position by adding the relative model position to the voxels position. The final location the model is defined by a dense cluster in the candidate space (known as Hough space). The resulting model position is used to plan the cardiac views similar in FIG. 1. The planned cardiac views are then displayed on the display device 30 of the planning device 16 including at least a short axis (SA) view, a long axis two chamber view, LA three chamber (3CH) view, and LA four chamber (4CH) view.

Implementations of further clinical workflows are embodied by changes in injection timing and agent usage. Specifically, the workflow enables cardiac stress agents with a long half-life to be administered before the patient enters the scanning room. Also, contrast agents are selectively absorbed by the heart can take ten minutes before they optimally display scar tissue. These two can be administered prior to the patient entering the scan room. By administering agents prior to entering the scan room, MR compatible agent administration equipment is not required.

The planning device 16 includes at least one processor 50 executing computer executable instructions on at least one memory 52 thereof. The computer executable instructions carry out the functionality of the planning device 16 and include the planning application 22. In one embodiment, the processor is programmed to perform the steps described in conjunction with FIG. 6. Further, the planning device 16 can include a communication unit 54 and/or at least one system bus 56. The communications unit 54 provides the processor 50 with an interface to at least one communication network. The communications unit 54 can, for example, be employed to communicate with the imaging modalities 12 and/or the image memories 14. The system bus 56 allows the exchange of data between the display device 30, the user input device 28, the processor 50, the memory 52 and the communication unit 54.

Figure 6:
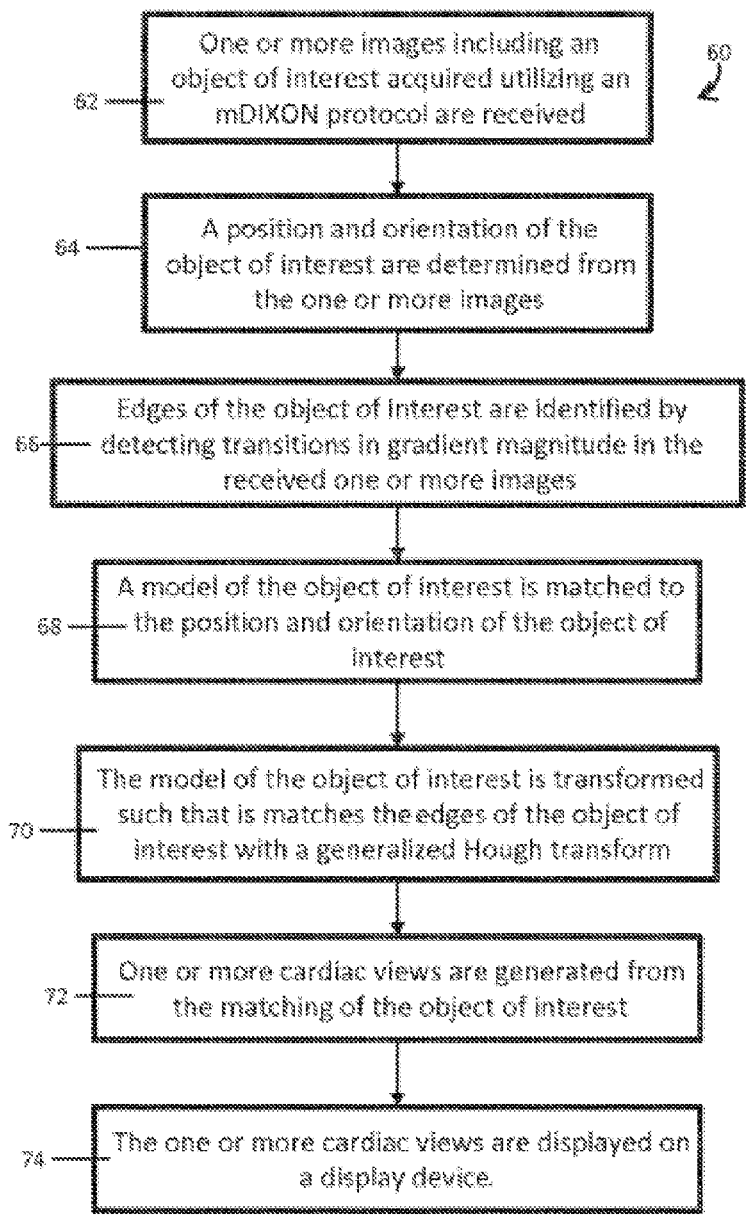
FIG. 6 illustrates a block diagram of a method for planning standard cardiac view in accordance with the present application.

To plan views of the OOI 20 in the received image 18, the planning application 22 employs a method 60 of FIG. 6. In a step 62, one or more images, e.g. water or fat images, including an object of interest, e.g. heart, acquired utilizing an mDIXON protocol are received. A position and orientation of the object of interest are determined from the one or more images in a step 64. In a step 66, edges of the object of interest are identified by detecting transitions in gradient magnitude in the received one or more images. A model of the object of interest is matched to the position and orientation of the object of interest in a step 68. In a step 70, the model of the object of interest is transformed such that is matches the edges of the object of interest with a generalized Hough transform. One or more cardiac views, e.g. the short axis view, long axis (LA) two chamber (2CH) view, LA three chamber (3CH) view and LA four chamber view, are generated from the matching of the object of interest in a step 72. In a step 74, the one or more cardiac views are displayed on the display device.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), a field-programmable gate array (FPGA), and the like; a user input device includes one or more of a mouse, a keyboard, a touch screen display, one or more buttons, one or more switches, one or more toggles, and the like; a database includes one or more memories; and a display device includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A system for planning cardiac MRI views, said system comprising:
   at least one processor programmed to:
   utilize an mDixon protocol scan sequence;
   receive one or more images including an object of interest acquired from the mDIXON protocol scan sequence wherein the one or more received images include a water image and a fat image of the object of interest;
   determine a position and orientation of the object of interest from the one or more images including identify edges of the object of interest by detecting transitions in gradient magnitude in the received one or more images, wherein the transitions provide a segmentation of the object of interest which is refined with non-maximum suppression;
   match a model of the object of interest to the position and orientation of the object of interest;
   generate one or more views of the object of interest from the matching of the object of interest; and
   display the one or more views of the object of interest on a display device.

2. The system according to claim 1, wherein the object of interest is a heart and the views include at least one of a short axis (SA) view, long axis (LA) two chamber (2CH) view, LA three chamber (3CH) view and a LA four chamber (4CH) view.

3. The system according to claim 1, wherein the model of the object of interest is matched to the position and orientation of the object of interest by operations including transforming the model of the object of interest such that the transformed model matches the edges of the object of interest with a generalized Hough transform.

4. The system according to claim 1, wherein the fat image provides a global location of the object of interest and the water image provides a location and orientation of the object of interest.

5. A method for planning cardiac MRI views, said method comprising:
   utilizing an mDixon protocol scan sequence;
   receiving one or more images including an object of interest acquired from the mDIXON protocol scan sequence wherein the one or more received images include a water image and a fat image of the object of interest;
   determining a position and orientation of the object of interest from the one or more images including: identifying edges of the object of interest by detecting transitions in gradient magnitude in the received one or more images, wherein the transitions provide a segmentation of the object of interest which is refined with non-maximum suppression;

matching a model of the object of interest to the position and orientation of the object of interest;

generating one or more object of interest views from the matching of the object of interest; and displaying the one or more object of interest views on a display device.

6. The method according to claim 5, wherein the object of interest is the heart and the views include at least one of a short axis (SA) view, long axis (LA) two chamber (2CH) view, LA three chamber (3CH) view and a LA four chamber (4CH) view.

7. The method according to 5, further including: transforming the model of the object of interest such that is matches the edges of the object of interest with a generalized Hough transform.

8. The method according to claim 5, further including: providing a global location of the object of interest from a fat image; and providing a location and orientation of the object of interest from the water image.

9. The method according to claim 5, further including: administering at least one of a contrast bolus for viability imaging and a long half-life stress agent for stress imaging.

10. The method according to claim 9, wherein the step of administering is performed prior to acquiring the one or more received images and outside a magnetic resonance examination room.

11. A non-transitory computer readable medium carrying software which controls one or more processors to perform the method according to claim 5.

12. A system for planning cardiac MRI views, said system comprising:

a planning device which includes at least one processor programmed to:

receive one or more images from an imaging device acquired in a single breath hold utilizing a cardiac gated mDIXON protocol wherein the one or more received images include a water image and a fat image of the object of interest;

determine a position and orientation of an object of interest from the one or more images including identifying edges of the object of interest by detecting transitions in gradient magnitude in the received one or more images, wherein the transitions provide a segmentation of the object of interest which is refined with non-maximum suppression;

transform a model of the object of interest such that is matches the object of interest using a generalized Hough transform;

generate one or more cardiac views from the matching of the object of interest; and a display which displays the one or more cardiac views.

13. The system according to claim 12, wherein the cardiac views include at least one of a short axis (SA) view, long axis (LA) two chamber (2CH) view, LA three chamber (3CH) view and a LA four chamber (4CH) view.

14. The system according to claim 12, wherein the fat image provides a global location of the object of interest and the water image provides a location and orientation of the object of interest.

* * * * *